United States Patent
Hunrath et al.

(10) Patent No.: US 9,545,017 B2
(45) Date of Patent: Jan. 10, 2017

(54) STRUCTURES FOR Z-AXIS INTERCONNECTION OF MULTILAYER ELECTRONIC SUBSTRATES

(71) Applicants: ORMET CIRCUITS, INC., San Diego, CA (US); INTEGRAL TECHNOLOGY, INC., Lake Forest, CA (US)

(72) Inventors: Christopher A Hunrath, San Juan Capistrano, CA (US); Khang Duy Tran, Anaheim, CA (US); Catherine A Shearer, San Marcos, CA (US); Kenneth C Holcomb, San Diego, CA (US); G Delbert Friesen, Santa Rosa, CA (US)

(73) Assignees: Ormet Circuits, Inc., San Diego, CA (US); Integral Technology, Inc., Lake Forest, CA (US)

( * ) Notice: Subject to any disclaimer, the term of this patent is extended or adjusted under 35 U.S.C. 154(b) by 0 days.

(21) Appl. No.: 14/183,488

(22) Filed: Feb. 18, 2014

(65) Prior Publication Data
US 2014/0231126 A1  Aug. 21, 2014

Related U.S. Application Data

(60) Provisional application No. 61/765,250, filed on Feb. 15, 2013.

(51) Int. Cl.
   *H01L 21/48* (2006.01)
   *H05K 3/40* (2006.01)
   *H05K 3/46* (2006.01)

(52) U.S. Cl.
   CPC .......... *H05K 3/4069* (2013.01); *H05K 3/4614* (2013.01); *H05K 3/4623* (2013.01); *H05K 3/4652* (2013.01); *H05K 2201/0195* (2013.01); *H05K 2201/10378* (2013.01); *H05K 2203/1194* (2013.01)

(58) Field of Classification Search
   CPC   H05K 3/4069; H05K 3/4614; H05K 38/4623; H05K 2/4652; H04L 21/4857
   USPC .......................................... 174/264
   See application file for complete search history.

(56) References Cited

U.S. PATENT DOCUMENTS

2011/0099806 A1*  5/2011  Koyama et al. ................. 29/849

* cited by examiner

*Primary Examiner* — Timothy Thompson
*Assistant Examiner* — Charles Pizzuto
(74) *Attorney, Agent, or Firm* — Mitchell Brustein

(57) ABSTRACT

Invention z-axis interconnection structures provide a means to mechanically and electrically interconnect layers of metallization in electronic substrates reliably and in any configuration. Invention z-axis interconnection structures comprise a novel bonding film and conductive paste and one- and two-piece building block structures formed therefrom.

20 Claims, 6 Drawing Sheets

STRUCTURES FOR Z-AXIS INTERCONNECTION OF MULTILAYER ELECTRONIC SUBSTRATES

RELATED APPLICATIONS

This application claims the benefit of priority under 35 USC §119 of U.S. Provisional Application Ser. No. 61/765,250 filed Feb. 15, 2013, the entire disclosure of which is incorporated herein by reference.

FIELD OF THE INVENTION

The present invention relates to z-axis interconnection structures provide a means to mechanically and electrically interconnect layers of metallization in electronic substrates reliably and in any configuration. Invention z-axis interconnection structures comprise a novel bonding film and conductive paste and one- and two-piece building block structures formed therefrom.

BACKGROUND OF THE INVENTION

Electronic substrates are the backbone of all electronic products. Due to the desire for high functionality in a small form factor, multilayer electronic substrates with a high density of circuitry or interconnect (i.e., high density interconnect or HDI), have become increasingly prevalent. The drive to higher circuit layer counts and finer circuit features has been relentless.

The Achilles heel of HDI electronic substrates is the interconnections that must be made in the z-axis direction between circuit layers. Traditionally these interconnections have been made by drilling through a multilayer electronic substrate and then plating the hole barrel with copper to interconnect the layers that the hole contacts. The problem with this type of z-axis interconnection is that the hole takes up space on every layer—including those where an interconnection is not required. As layer counts increase, an additional problem is that it becomes difficult to plate a consistent layer of copper throughout the entire depth of the hole barrel.

In order to overcome these deficiencies, it has become common practice in the industry to fabricate a central core by conventional means and then sequentially add layers of HDI to the outside surfaces of the core. In this method, the sequentially added layers are interconnected by "blind" vias (holes that traverses a dielectric and terminate at a copper pad below) that are located only where needed on each layer and are plated with copper to interconnect to the circuitry directly above and below. The problems with this approach are that the cumulative yield loss for the sequential processing is high, substantial increases in plating capacity are needed for implementation while such capacity requirements are continually increasing, and the via plating operation adds superfluous copper onto each outer circuit layer that is detrimental to the formation of fine circuit features.

One solution to these deficiencies is to install a conductive paste into vias that have been formed in a b-stage dielectric layer prior to lamination to effect z-axis interconnection. This process lends itself to both sequential and parallel fabrication methods. When a parallel process is used, all of the circuit layers can be fabricated in parallel and then joined in a single lamination cycle without the cumulative losses associated with creating an identical multilayer electronic substrate by sequentially laminating multiple layers. This solution also obviates the need for additional plating capacity and does not compromise the formation of fine circuit features. The problems with this method are that the conductive pastes used to form the interconnections are generally not as reliable as the copper-plated vias, and the b-stage dielectric materials typically used to adhere the circuit layers together during lamination are not well-suited to such a process.

Conductive Pastes

Conventional conductive pastes rely on point-to-point contact between metal particles in a polymer binder to effect electrical conduction. This reliance on point-to-point contact is the fundamental basis for the poorer reliability of these materials when compared the continuous metal of a plated via.

The conductivity and reliability of conventional conductive pastes may be sufficient for some applications, and the use of such conductive pastes can be cost-effective. However, in demanding applications, a more robust z-axis interconnection material is needed.

Transient liquid phase sintering (TLPS) pastes overcome the fundamental deficiency of conventional conductive pastes by providing a composition that sinters at lamination temperature to create a metallurgically interconnected metallic network that extends continuously from an overlying copper pad, through the bulk of the TLPS paste, and finally to the underlying copper pad. The use of TLPS compositions as suitable replacements for conventional electrically and/or thermally conductive materials has been used in a diverse assortment of applications, assembly of electronic components, in-plane circuit traces, interconnection of circuit traces on different planes, assembly of unpackaged integrated circuit die onto packaging elements, and the like. Some of the uses for TLPS compositions are described in U.S. Pat. Nos. 6,716,036; 5,980,785; 5,948,533; 5,922,397; 5,853,622; 5,716,663; 5,830,389; 8,221,518; and U.S. Patent Application Publication No. 2011-0171372, which are incorporated by reference herein in their entirety.

Each application presents a specific set of application-specific requirements. TLPS compositions confer an advantage over conventional materials in meeting requirements that include ease of deposition, reduction in manufacturing time and/or complexity, increased circuit density in the resultant article, environmentally stable interfaces, high electrical and/or thermal conductivity, and many others. For use in vias in multilayer electronic substrates the disclosures of U.S. Pat. Nos. 5,948,533 and 8,221,518 and application Publication No. 2011-0171372 are particularly relevant.

TLPS pastes have been demonstrated to form extremely reliable interconnects in multilayer electronic substrates using conventional b-stage lamination adhesives; however, as via sizes become smaller to match shrinking circuit pad size, the use of standard b-stage lamination adhesives not designed for a paste process becomes more problematic.

Bonding Sheets

Typical bonding sheets used for lamination of multilayer electronic substrates are made of thermosetting resins that have been infiltrated into a woven glass mat reinforcement matrix. This type of construction is known as a "prepreg" (woven glass mat pre-impregnated with resin). In HDI electronic substrate applications, where the object is to prepare the smallest and thinnest parts possible, the prepreg is generally selected to have a relatively low glass and a relatively high resin content. Not only do these characteristics facilitate a thin and lightweight part, the low glass density is more amenable to laser ablation to form via holes. This type of configuration is well-suited to the sequential, copper-plated-via process.

Handling of the very thin prepregs used for HDI is difficult. Creating conductive-paste-filled via holes in free-standing prepregs, even with protective coversheets, is particularly difficult to accomplish without damaging or distorting the prepreg. Any distortion is likely to cause misalignment of the vias from one or both of the circuits to be interconnected. In some circumstances, handling issues can be mitigated by tack laminating the prepreg to one of the circuit layers that will be joined by lamination. Nevertheless, other characteristics of HDI prepregs are also detrimental to conductive paste interconnect processes.

In copper-plated-via processes, the bonding sheets used are not subject to thermal processing prior to lamination and high flow is desirable for encapsulating the fine circuit features. Variations in bonding sheet flow characteristics that can be introduced during storage are generally well-tolerated by the process.

In contrast, in paste-filled via processes the bonding sheets are subjected to several intermediate handling steps and often multiple thermal excursions (e.g. tack laminating and extraction of volatiles from the conductive paste), prior to lamination. These intermediate steps can interfere with the ability of the bonding sheet to properly encapsulate and adhere to the circuit layers due to a reduction in flow. Conversely, if the flow of the bonding sheet adhesive is too high, it can migrate to the bottom of the blind via and coat the copper pad, thus preventing connection; it can also flow laterally where it can change the shape or even the position of the via; it can carry a portion of the deposited paste away from the via; and/or it can intermingle with the conductive paste thereby prevent the formation of the conductive pathway. For conductive paste interconnect, unlike copper-plated-via interconnect, flow control of the bonding sheet is critical.

The flow characteristics of standard bonding sheets can be managed by characterization and input of thermal work into the prepreg to achieve optimal flow for specific circumstances. Circuit designs that maximize the amount of copper on mating circuit layers can also be used to limit the amount of lateral flow. However, this is a laborious solution and may not fully address flow issues.

Prepreg bonding sheets characterized as no-flow are available. These materials are generally unaffected by the pre-lamination process steps required for conductive paste vias, and do not cause the interconnect defects associated with high flow resins. The disadvantages of no-flow prepregs are that there is a much more limited selection of materials, it can be more difficult to develop a lamination process using no-flow prepregs that achieves good encapsulation and adhesion for a given part configuration, and available no-flow prepregs are reinforced with woven glass mats.

The woven glass mats used to create prepregs provide good handling and dimensional control characteristics, but they are also a potential source of defects in conductive paste interconnects. The unit size of the glass weave is generally on order of the via hole size. This means that the immediate periphery of each via will vary greatly with regard to resin and glass content. In addition, the lighter glass weaves used for HDI prepregs provide significantly less control over the coefficient of thermal expansion (CTE), while limiting the thinness of the joint that can be achieved. Therefore, the CTE, particularly in the z-axis direction, is relatively high, but the thickness of the glass fabric limits the ability to mitigate any CTE mismatch between the conductive paste and prepreg. Due to the poorer electrical characteristics of glass relative to prepreg resins, a prepreg containing glass must be thicker than one containing resin alone to achieve the necessary dielectric characteristics. Because prepreg resins and glass require different levels of laser energy for ablation, via holes formed in b-stage prepregs will always exhibit some irregularity, which can complicate paste deposition and cause variation in the electrical performance of the conductive paste-filled vias. Finally, adhesion deficiencies between the prepreg resin and glass filaments, such as non-wetting, can create pathways for conductive pastes and/or plating solutions to migrate away from the via structure.

Bonding sheets in which aramid (polymer) fibers replaced the woven glass mats were introduced to alleviate the glass knuckle and lasing issues, but they suffered from high dimensional instability due to moisture absorption, and irregularity of resin penetration into the mat during the infiltration process and have been withdrawn from the market.

Film adhesives have the potential to alleviate all of the issues noted above, but those currently available have a high flow characteristic that tends to sweep conductive vias away.

To take advantage of the cost control, yield improvement, reduction in capital equipment requirements, density capability and design versatility offered by a conductive-paste-filled-via z-axis interconnection strategy for multilayer HDI electronic substrate, what is needed is a building block that provides an electronic substrate substructure bearing an electrically conductive element, that is coupled with an all-polymer bonding film having a portion thereof in a no-flow, b-staged form, with via holes that traverse the thickness of the bonding film, where such via holes are filled with, and/or aligned with bumps formed from a conductive paste that will become a continuous electrical pathway during lamination.

SUMMARY OF THE INVENTION

The present invention provides electronic substrate z-axis interconnection structures that include a bonding film, which includes a reinforcing matrix of c-stage thermosetting resin surrounded by a b-stage thermosetting resin and optionally a particulate filler, and at least one hole traversing the bonding film that is filled with a conductive paste. In certain embodiments, the c-stage thermosetting resin and the b-stage thermosetting resin are co-cast from a miscible mixture of a c-stageable resin and a b-stageable resin that cure independently but remain intermixed. In certain aspects, the c-stage thermosetting resin cures at a temperature less than about 100° C. and the b-stage thermosetting resin has a cure onset temperature greater than 160° C.

The c-stage thermosetting resin can be an epoxy, a phenolic, a polyester, a polyimide, an acrylic or combinations thereof. For example, the c-stage thermosetting resin can be those formed from Bisphenol A or Bisphenol F and epichlorohydrin (e.g. an epoxy, such as Epon® 828 (bisphenol A diglycidyl ether).

The b-stage thermosetting resin can be a benzoxazine, a polyimide, a bismaleimide-triazine or combinations thereof. For example, the b-stage thermosetting resin can be a benzoxazine such as Araldite® MT 35700 (bisphenol F benzoxazine).

In some embodiments, the bonding film is traversed by at least two holes that are filled with the conductive paste. In other embodiments, the bonding film is traversed by at a plurality of conductive paste-filled holes that are arranged in a pattern.

In certain aspects of the invention, a protective sheet covers one or both surfaces of the bonding film. For example, the bonding film can be cast directly on the protective sheet, or the protective sheet or sheets can be applied to the film after casting. Optionally, the at least one hole in the bonding film also traverses the protective sheet or sheets. The protective sheet can be, for example, a metal foil sheet, a paper sheet, a coated paper sheet, or a polymer sheet.

The conductive paste can be any known in the art, but is typically a sintering paste, such as a transient liquid phase sintering paste.

The present invention also provides electronic substrate z-axis interconnection assemblies that include bonding films according to the invention. In one embodiment, the electronic substrate z-axis interconnection assembly includes two z-axis interconnection structures of the invention with a dielectric sheet between the two z-axis interconnection structures. Optionally, the assembly is tack-laminated. This assembly can include a conductive paste filled hole traversing all or part of the assembly. Dielectric sheets are well known in the art and can be selected from ceramics, glass, thermoplastic or thermosetting polymers optionally reinforced or filled with particulate matter, and combinations thereof.

In another embodiment, the invention provides electronic substrate z-axis interconnection assemblies that include an electronic substrate substructure attached to at least one z-axis interconnection structure of the invention. Optionally, the assembly is tack-laminated. The electronic substrate substructure can be, for example, a metal foil, a preform, a clip, a lead frame, a tape, a dielectric sheet or a core. When the electronic substrate substructure is a dielectric material, it can be any of the dielectric materials indicated above, and can include metallization on one or both major surfaces, which metallization can be patterned or unpatterned. In some instances, where the electronic substrate substructure is a core, the core can include a plurality of dielectric and metallization layers. In certain aspects an outer layer (major surface) of the core is a metallization layer, which can be patterned or unpatterned. The core can further be partially or completely traversed by at least one hole, such as a plated through hole filled with a conductive paste; a plated through hole filled with a non-conductive paste; an unfilled plated through hole; a plated electrically conductive via filled with a conductive paste; an unplated electrically conductive via filled with a conductive paste; or an unfilled, plated electrically conductive via.

The invention also provides an electronic substrate z-axis interconnection assembly comprising an electronic substrate substructure bearing at least one bump formed from a conductive paste; and a z-axis interconnection structure to a bonding film that includes a reinforcing matrix of c-stage thermosetting resin surrounded by a b-stage thermosetting resin; and optionally, a particulate filler; wherein the at least one hole is aligned with the at least one bump.

The invention further provides an electronic substrate z-axis interconnection assembly comprising an electronic substrate substructure bearing at least one bump formed from a conductive paste; and an electronic substrate z-axis interconnection structure comprising at least one hole traversing the bonding film, wherein said at least one hole aligns with said at least one bump.

In yet another embodiment, the invention provides electronic substrate z-axis interconnection assemblies that include an electronic substrate substructure (as described above) bearing at least one bump formed from a conductive paste and an electronic substrate z-axis interconnection structure of the invention having the at least one hole of the z-axis interconnection structure aligned with the at least one bump of the electronic substrate substructure. Optionally, the assembly is tack-laminated. The electronic substrate substructure can be any of those listed above and the bump is typically deposited by dispensing, jetting, screen printing, stencil printing, pad transfer and gravure.

BRIEF DESCRIPTION OF THE DRAWINGS

FIG. 6A illustrates structures formed using a conventional conductive paste and FIG. 6B shows identical structures formed using TLPS paste.

DETAILED DESCRIPTION OF THE INVENTION

Definitions

Figure 1:
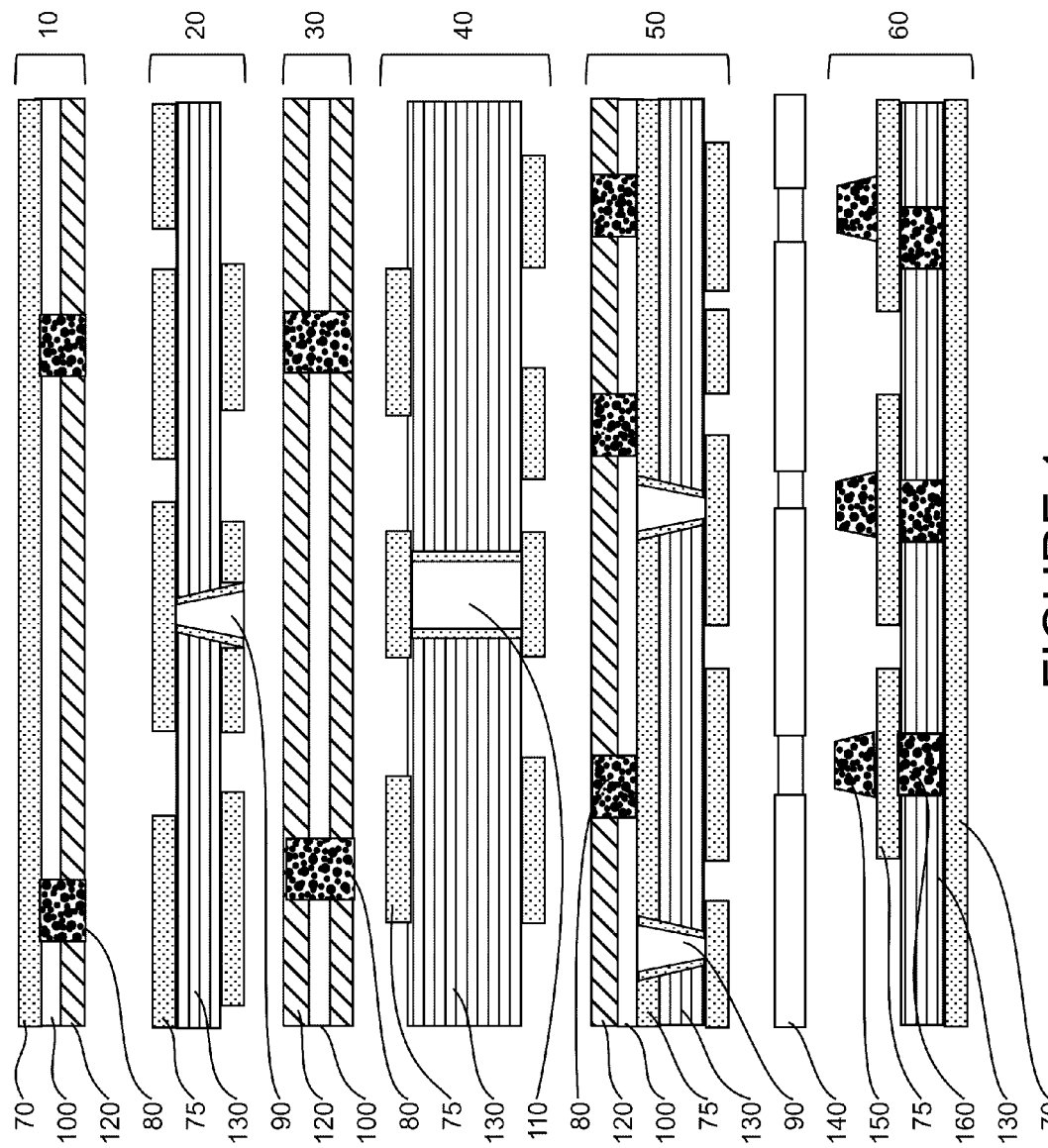
FIG. 1 is a diagram illustrating several different embodiments of invention z-axis interconnect structures in cross-section.

As used herein, "or" means "and/or" unless stated otherwise. Furthermore, use of the term "including" as well as other forms, such as "includes," and "included," is understood as "comprising" and is not limiting. It is to be understood that as used in the specification and in the claims, the singular form of any word can also refer to the plural, depending upon the context in which it is used. For example, "a" or "an" can mean one or more, depending upon the context in which it is used. Thus, reference to "a metal" can mean at least one metal, two metals, or a plurality of metals.

"About" or "approximately" as used herein, means that a number referred to as "about" or "approximately" comprises the recited number plus or minus 1-10% of that recited number. For example, about 50 degrees can mean 45-55 degrees or as few as 49-51 degrees depending on the situation. Whenever it appears herein, a numerical range, such as "45-55", refers to each integer in the given range; e.g., "45-55%" means that the percentage can be 45%, 46%, etc., up to and including 55%. Where a range described herein includes decimal values, such as "1.2% to 10.5%", the range refers to each decimal value of the smallest increment indicated in the given range; e.g. "1.2% to 10.5%" means that the percentage can be 1.2%, 1.3%, 1.4%, 1.5%, etc. up to and including 10.5%; while "1.20% to 10.50%" means that the percentage can be 1.20%, 1.21%, 1.22%, 1.23%, etc. up to and including 10.50%.

As used herein, the term "substantially" refers to a great extent or degree. For example, "substantially all" typically refers to at least about 90%, frequently at least about 95%, often at least 99%, and more often at least about 99.9%.

The term "major surface" is used generally to refer to the surface(s) of a part, structure, substructure, element or the like, that has the greatest surface area. For example, where the part is a generally flat, rectangular element, such as a board or a sheet that has relatively large top and bottom surfaces, and four smaller, narrow edge or side surfaces, the top and bottom are referred to as "major surfaces", while the four edge surfaces are referred to as "minor surfaces".

"Z-axis interconnect" and "z-axis interconnection" are used interchangeably herein to refer to electrical interconnections that extend substantially perpendicular to (along the "z-axis") substantially planar layers of circuitry. Z-axis interconnects effect electrical connection between or among ("inter") two or more substantially parallel-oriented circuit layers and may include one or more electrical connections.

"Electronic substrate" is generic term used to describe an electrical interconnection structure to which one or more electronic components is assembled and by which electrical signals are distributed to other electronic components/elements. An electronic substrate often provides all or at least a part of the mechanically durable platform in an electronic product. The term "electronic substrate," as used herein, also encompasses structures that integrate optical and electronic signals.

"Electronic substrate substructure" and "electronic substrate subconstruction" are used interchangeable to refer to sub-elements or sub-layers that are joined together to form an electronic substrate. Electronic substrate substructures are building blocks that can be prepared in advance and then assembled in various combinations to form multilayer electronic substrates meet specific and/or specialized requirements The term "printed circuit board" or "PCB refer to a specialized form of electronic substrate typically used to mechanically support, assemble and electrically interconnect discrete electronic devices, and which typically supports a multiplicity of such devices.

"Semiconductor package substrate" as used herein, refers to a specialized form of electronic substrate that has traditionally been used to connect to a single semiconductor device and distribute electrical signals therefrom to a larger size format device. Increasingly, semiconductor package substrates are used to support more than one semiconductor device and/or may support auxiliary electronic devices such as resistors, capacitors and inductors.

An "interposer" is an electronic substrate substructure in which the outer major surfaces bear only the termination of z-axis interconnection pathways as circuit elements. Interposers are typically used to mechanically join and electrically interconnect electronic substrate subconstructions, dissimilar electronic substrates, and the like. For instance, in certain embodiments of the invention, an interposer consists of bonding film traversed by through vias that have been filled with conductive paste.

"Connector" refers to a termination on an electronic substrate that is used, for instance, to electrically interconnect an electronic substrate to another electronic substrate or to connect an electronic substrate to another element in an electronic device, such as a user interface. Typically, a connector is formed by electrically interconnecting a flexible circuit with a rigid electronic substrate subconstruction. Invention structures may be advantageously used to effect the mechanical and electrical interconnection between such elements.

"Multilayer electronic substrate", as used herein, refers to an electronic substrate including more than 2 layers of metallization. Typically, holes are drilled through the multilayer electronic substrate such that they traverse all or part (e.g., one or more of the layers) of a multilayer electronic substrate and the holes are filled with an electrically conductive medium to connect the metallization layers in the z-axis. This creates a "web" of conductors for complex connections to many devices. Layer counts can be as low as 3, commonly 12 to 20, and as many as 70 or more.

"Flex circuit" refers to electronic substrates based on flexible materials, typically films and foils (e.g. copper). Such forms of electronic substrate can make bends either to facilitate installation, or where required of the substrate in use.

"Dielectric", "dielectric material" and "electrical insulator" are used interchangeably to refer to a material that is highly resistant to the conduction of electricity. Common dielectric materials include porcelain, glass, most plastics (i.e., polymers) and resins, mica, and the oxides of various metals.

"Matrix", as used herein, is reinforcing structure used to provide mechanical stability, good handling characteristics and improved physical properties to polymer adhesive materials used, e.g., in bonding sheets. Typical matrices are woven, knitted and/or otherwise intermingled, and may be amorphous or porous. A pre-existing matrix may be infiltrated with a bonding adhesive to form a bonding sheet, or in certain embodiments of the invention, the matrix may be formed in situ from, for instance, co-casting a bonding adhesive with a matrix-forming polymer.

"Polymer laminate"—A polymer laminate is a fundamental building block of electronic substrates. A polymer laminate comprises a fully processed or "c-staged", reinforced or unreinforced polymer dielectric layer that has been bonded on one or both major surfaces to metal foil (e.g., copper foil) via the process of "lamination", which uses heat, pressure and/or adhesives to bond materials together. Polymers suitable for use in electronic substrate polymer laminates include, but are not limited to, epoxies, acrylics, polyimides, bismaleimide-triazines, cyanate esters, phenolics, fluoropolymers, polycarbonates, polyesters and the like.

The terms "core" and "innerlayer" are used interchangeably to refer to a central electronic substrate substructure onto which additional electronic substrate substructures are attached and electrically interconnected to form a completed multilayer electronic substrate. A core typically includes one or more polymer laminates on which metallization has been patterned into circuit layers, which circuit layers are then electrically interconnected by copper-plated through holes.

"B-stage" refers to a thermosetting polymer or resin that has been "dried" to a substantially non-tacky state such that it can be used in configurations such as sheet form. A b-stage polymer has not been chemically cured, or is only partially chemically reacted or "cross-linked," so it may be used to chemically bond adherands together. In some aspects, b-stage materials behave behaves similarly to thermoplastic materials at low temperatures (e.g., during tack lamination) but can be thermoset to fully cure at higher temperatures. "B-stageable" refers polymers that can form B-stage adhesives such as films. Such adhesives can allow for low tack lamination temperatures while providing high thermal stability when fully cured at lamination temperature.

"C-stage" refers to a polymer or resin that is fully cross-linked (i.e., thermoset) that is commonly used as a dielectric in electronic devices. "C-stageable" refers to an adhesive that can be cured to a cross-linked form. In certain embodiments of the present invention, the resin used to form the reinforcing matrix is cured from a liquid to c-stage form without an intermediate b-stage.

"Thermoplastic" refers to a thermoplastic is a polymer material that will melt when exposed to elevated temperature, and solidify upon return to a lower temperature without undergoing extensive change in molecular structure (e.g., crosslinking) during such elevated temperature cycles. Thermoplastic polymers act as adhesive bonding agents by melting, wetting to the surfaces to be joined and then solidifying.

"Thermoset," as used herein, refers to the ability of a polymer or resin to irreversibly "cure" resulting in a single three-dimensional network that has greater strength and less solubility compared to the non-cured product. Thermoset materials are typically polymers that may be cured, for example, through heat (e.g. above 200° Celsius), via a chemical reaction (e.g. epoxy ring-opening, free-radical polymerization, etc or through irradiation (e.g. visible light, UV light, electron beam radiation, ion-beam radiation, or X-ray irradiation).

Thermoset materials, such as thermoset polymers or resins, are typically liquid or malleable forms prior to curing, and therefore may be molded or shaped into their final form, and/or used as adhesives. Curing transforms the thermoset resin into a rigid infusible and insoluble form by a cross-linking process. Thus energy (e.g., heat) and/or catalysts are typically added that cause the molecular chains to react at chemically active sites (unsaturated or epoxy sites, for example), linking the polymer chains into a rigid, 3-D structure. The cross-linking process forms molecules with a higher molecular weight and resultant higher melting point. During the reaction, when the molecular weight of the polymer has increased to a point such that the melting point is higher than the surrounding ambient temperature, the polymer becomes a solid material.

"Bonding sheet" refers to an adhesive sheet that is used, for example, to bond electronic substrate subconstructions together during lamination to form an electronic substrate. A bonding sheet may consist entirely of adhesive material or may also include a reinforcing material, such as a matrix, and/or fillers.

"Adhesive film" is a polymer bonding sheet that does not contain a reinforcing matrix. An adhesive film may be either a thermoplastic or thermosetting material.

"Flow" as used herein, refers to the movement of adhesive materials, particularly lateral movement of polymer adhesives in films and sheets, such as bonding sheets and bonding films.

"No flow" is a term applied to bonding sheets in which the adhesive resin can be physically displaced to conform to irregularities in the surfaces that are bonded together, but does not flow laterally under lamination conditions.

"Prepreg" refers to a type of bonding sheet used to create electronic substrates by bonding electronic substrate substructures together during lamination. Prepregs are prepared by providing a woven, entangled, amorphous or porous matrix into which a bonding adhesive is "pre-impregnated" for use as a sheet bonding material. The matrix is most typically fiberglass cloth.

"Bonding film" is a type of bonding sheet in which both the bonding adhesive and the reinforcing matrix are formed from polymer materials. In certain embodiments, the bonding adhesive and the reinforcing matrix are co-cast in a single operation from liquid precursor formulations. In certain embodiments of the invention, the bonding sheets employed in the invention structures are bonding films.

"Interpenetrating network polymer" or "IPN" refers to a polymer preparation in which two or more polymer resins with discrete chemical curing mechanisms, are prepared in a stable mixture such that each polymer resin independently cures (partially or fully) without affecting the cure of the other, but each polymer remains fully integrated with the other in the preparation. Certain bonding films of the invention may be classified as a two-resin-system IPN polymer preparations, in which one resin acts as a matrix-former and the other resin serves as a bonding adhesive. In certain aspects, the matrix-forming polymer in the IPN is a c-stageable polymer and the bonding adhesive is b-stageable, with the cast bonding film having a c-staged matrix integrated with or interpenetrating a b-staged polymer adhesive.

A "protective sheet" is a disposable material in sheet form that is used to protect surfaces of electronic substrate substructures during some or all of the process steps necessary to assemble and prepare an electrically interconnected electronic substrate. Protective sheets can also facilitate handling of e.g. thin and/or delicate materials. Exemplary protective sheets are metal foils, paper and polymer films.

"FR4" refers to a common category of printed circuit board dielectric laminates and prepregs that are epoxy based, reinforced with woven glass fabric and include a brominated flame retardant.

"Plated trough hole" or "PTH" refers to holes drilled in an electronic substrate or electronic substrate substructure and "seeded" with a conductive material for electroplating. Such holes are typically plated with copper to electrically connect the circuit layers in the z-axis. These holes may be used to receive leads from electronic components, or may simply be a means to effect z-axis interconnection of circuit layers.

A "through via" is a small diameter hole that traverses an entire electronic substrate substructure and electrically interconnects the layers that are traversed. Through vias are differentiated from through holes in that they are smaller in diameter and often only traverse a substructure rather than the completed electronic substrate.

A "blind via" is a small diameter hole that only extends partially through the electronic substrate or electronic substrate substructure. Blind vias are used for z-axis connections between specific layers without consuming surface area in other layers. Blind vias may be copper plated or filled with a conductive paste.

"Aspect Ratio" as used herein, refer to the relationship between the diameter of a hole or via and its height. For example, a via with diameter equal to its height (10 mm in diameter and 10 mm tall) has a 1 to 1 aspect ratio.

"High density interconnect" or "HDI" refers to a type of electronic substrate with thin layers and very small conductors and spaces for packing many circuits in a small area.

"Any Layer" HDI refers to an electronic substrate technology with unrestricted via (z-axis interconnect) placement on each layer, which provides the best circuit routing possible and very high circuit density.

"Metallurgical Bond" refers to a permanent bond resulting from the commingling of metal layers by interdiffusion of metallic elements such as metal particles, metal foils, metal circuitry and other forms of metal found in electronic structures. A metallurgical bond creates a pathway for electrical and thermal conduction between layers in addition to mechanical bonding.

"Registration" refers to the process of aligning layers in multilayer electronic substrates such that the desired electrical interconnections may be effected. The electronic substrate z-axis interconnection structures of the invention provide outstanding z-axis registration and allow alignment and lamination of e.g., circuit layers that are "in register" with each other.

"Lamination" refers to a process used in electronic substrate manufacturing whereby layers are bonded together using bonding sheets (adhesive layers), such a the bonding films of the invention, in a press that applies heat, pressure and often vacuum. Thermosetting bonding sheets are converted from b-stage to c-stage (fully cured or cross-linked) during this process. A complex electronic substrate may be subjected to this process multiple times.

"Tack Lamination" refers to a process whereby two or more layers (e.g., a bonding sheet and an electronic substrate subconstruction) are temporarily bonded together with just enough heat to attach the layers, but without fully curing (e.g., without effecting a full chemical cross-linking reaction) the adhesive polymer(s) that laminating relies on. This purpose of this process is to promote ease of handling of the bonding sheet through any processing required and to assist with registering z-axis interconnections formed in the bonding sheet with the underlying circuitry.

"Encapsulation" refers to fully covering an electronic circuit or other element with a protective or insulative coating, such as a polymer. As used herein, "encapsulation" generally refers to the conformance of a bonding sheet to the circuit topology a major surface of an electronic substrate subconstruction such that air is not entrapped and the circuit features emerge from lamination fully enveloped by polymer(s) in the bonding sheet.

"Sequential Lamination" refers to a method of making complex multilayer electronic substrates in which the substrate is formed through a series of bonding (laminating) steps, whereby a plurality of (at least three) or a multiplicity of (at least ten) layers are laminated one or two at a time. Typically, copper foil and bonding sheets are laminated to one or both sides of a central dielectric core, one or two at a time, after which z-axis interconnections between the newly added foil and dielectric core are fabricated, followed by patterning the outer foils into circuits. This process is repeated to add additional layers of circuitry until the desired number of layers is reached. In some instances, the bonding sheets are traversed by vias that have been filled with conductive paste so that the z-axis interconnection between the foil and the core is effected during the lamination cycle, thus reducing the number of process steps required to prepare the subconstruction for the next lamination cycle.

"Parallel Lamination" refers a method of making a multilayer electronic substrate by bonding (laminating) many electronic substrate subconstructions together in a single lamination operation. Bonding sheets are used between each electronic substrate subconstruction. Z-axis electrical connection is effected by creating plated through holes in the laminated construction, or, as disclosed in the present specification, by creating vias in the bonding sheets and filling the vias with conductive paste prior to lamination.

Figure 8:
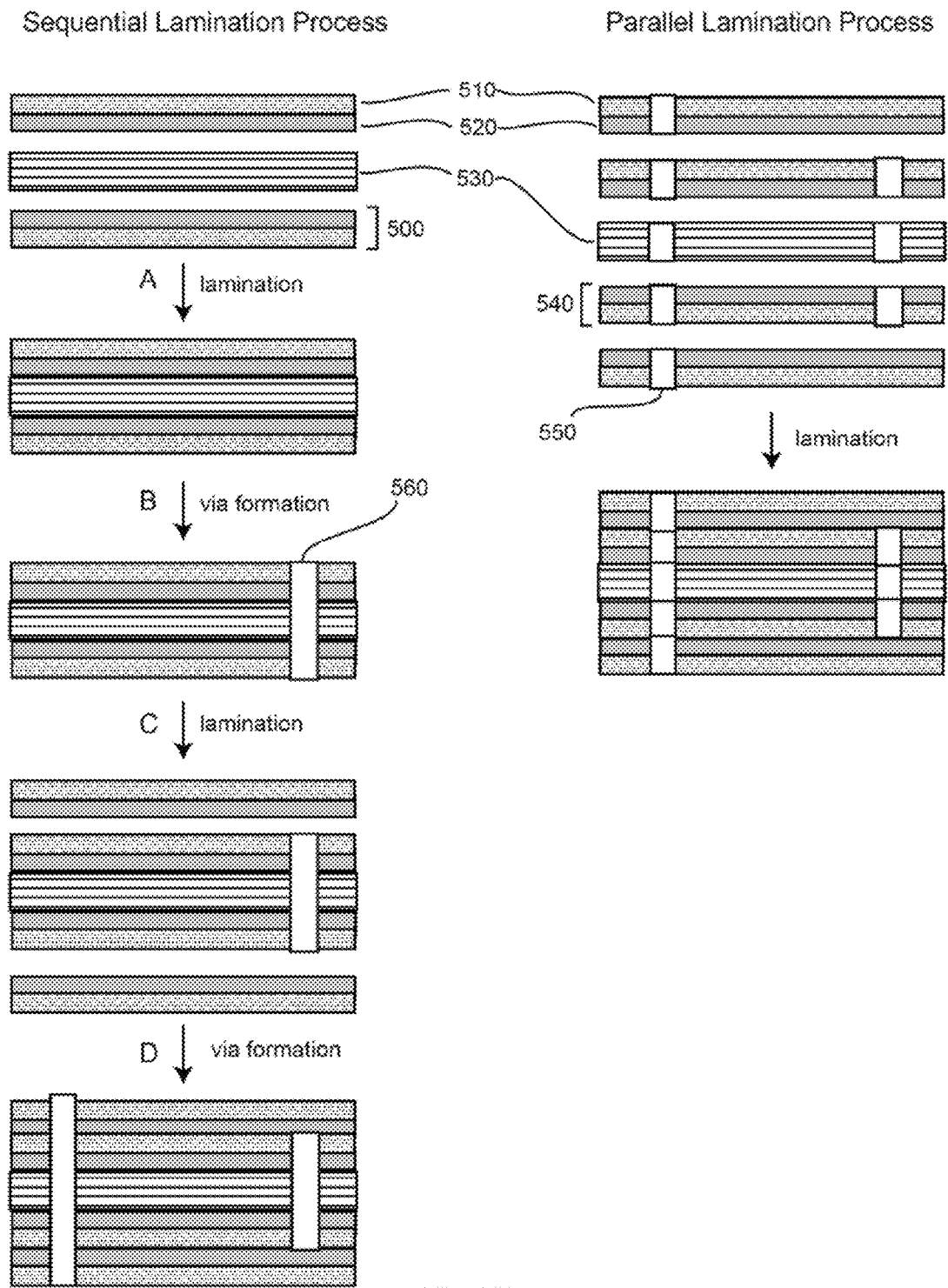
FIG. 8 is a simplified schematic drawing comparing step in an exemplary sequential lamination process with those in an exemplary parallel lamination process.

FIG. 8 illustrates steps in simplified sequential and parallel lamination processes. Certain steps (e.g., preparation of subconstructions, via plating and filling, and circuit etching) are not show so that the overall process can be illustrated in a simplified form. In sequential lamination (left side), subconstructions (500) including a bonding sheet (520) and a copper foil (510) are laminated onto the top and bottom sides (major sides) of a central core (530) (step A). Following lamination, vias (560) are drilled to connect copper layers. (step B). Vias 560 are plated and circuit patterns are formed (not shown). Additional subconstructions are laminated to the growing construction (step C), and via holes are then formed (step D) to connect the newly-added layers.

In parallel lamination, (right side) a plurality of subconstructions, each including a bonding sheet (520) and copper foil (510) are prepared. Vias (550) are pre-drilled and conductively filled or plated prior to lamination to form via-containing subconstructions (540). When all the subconstruction layers are available, they are aligned and bonded together with a central core (530) in a single lamination step. While the details of each step in the two processes may vary and even overlap, it will be apparent to the skilled artisan that parallel lamination requires fewer lamination steps than the sequential process.

"Daisy Chain" refers to a pattern of circuits interconnected with z-axis vias to form one continuous circuit or net. This type of circuit is often used as a test vehicle, where only the end points of the circuit need to be tested electrically because any defect in the net can easily be detected through the single electrical test. Circuit geometries, via diameter and type (PTH, through via, blind via) are selected to represent the design under test. A daisy chain may also be thermally tested to simulate assembly as a measure of reliability.

"Laser ablation" is a technique for selectively removing material from a construction by exposing it to a sufficient amount of laser energy to vaporize or decompose the unwanted material. Laser ablation is typically performed with UV or $CO_2$ lasers to produce vias and specialized features in electronic substrates.

"Conductive paste" as used herein, refers to a composition containing metal particles dispersed in a fluid medium. After thermal processing, the metallic particles in conductive pastes are held in close physical contact with each other or are metallurgically bonded together, thereby forming a continuous electrical connection.

"Delamination" refers to the failure of an electronic substrate or electronic substrate subconstruction in which two or more layers within the substrate or subconstruction have wholly or partially separated from each other.

"Flux" as used herein, refers to a substance, often an acid or base, used to promote fusing of metals and in particular, removes and prevents the formation of metal oxides.

The terms "melting temperature" or "melting point," as used herein, refer to the temperature (a point) at which a solid becomes a liquid at atmospheric pressure.

The term "differential scanning calorimetry" ("DSC") refers to a method of thermal analysis in which the difference in the amount of heat required to increase the temperature of a sample and reference are measured as a function of temperature. DSC is used to investigate the physical characteristics (e.g. melting) and reaction kinetics of substances of interest.

The term "sintering" refers to a process in which adjacent surfaces of metal powder particles are metallurgically bonded by heating. "Sinterable" refers to materials that can be sintered. "Liquid phase sintering" refers to a form of sintering in which the solid powder particles coexist with a liquid phase. Densification and homogenization of the mixture occur as the metals diffuse into one another and form new alloy and/or intermetallic species.

In "transient liquid phase sintering" or "TLPS", the liquid phase exists for a only short period of time as a result of the homogenization of the metals to form a mixture of solid alloy and/or intermetallic species. The liquid phase has a very high solubility in the surrounding solid phase, thus diffusing rapidly into the solid and eventually solidifying. Diffusional homogenization creates the final composition without the need to heat the mixture above the solidus temperature of the HMP metal. In practice, TLPS results in metallurgical bonding within conductive pastes, and between the processed paste particles and typical metallic circuit finishes.

The terms "high melting temperature metal", "high melting point metal" or "HMP metal" as used herein, refer to a metal having a melting temperature that is equal to, or higher than, about 400° C. HMP metals include Cu, Ag, Pd, Au, Al, Ni, Be, Rh, Co, Fe, Mo, W, Mn and Pt. Typically, the HMP metal used in the compositions of the present invention is Cu, Ag, Pd, Au, Al, Ni or Pt, and most frequently the HMP metal is either Cu or Ag.

The terms "low melting temperature metal", "low melting point metal" or "LMP metal" as used herein, refer to a metal having a melting temperature that is lower than about 400° C. Exemplary LMP metals include Sn, Bi, Zn, Ga, In, Te, Hg, Tl, Sb, Se, Po, Pb, Cd, and Po in an alloy of these metals. Typically, the LMP metal used in the compositions of the present invention is Sn, Bi, Pb, Ga, In or Zn, and most frequently the LMP is Sn in an alloy.

The "Coefficient of Thermal Expansion" or "CTE" is a term of art describing a thermodynamic property of a substance. The CTE relates a change in temperature to the change in a material's linear dimensions. As used herein "$\alpha_1$ CTE" or "$\alpha_1$" refers to the CTE before the $T_g$, while "$\alpha_2$ CTE" refers to the CTE after the $T_g$.

Electronic substrates, such as printed circuit boards, are prepared in layers to accommodate complex circuitry in a small area. Such circuitry is formed on the layers in a 2 dimensional format (X axis×Y axis) on the generally planar layers. Circuits formed on different layers insulated from each other by alternating dielectric layers with circuit layers in the substrate. The generally planar circuits are connected vertically (Z axis) by drilling holes (vias) that form conductive pathways between the layers of circuitry. The pathways are then made conductive by metal plating or filling with a conductive paste. The layers are bonded together through lamination in either a sequential process (one or two layers at a time), or in a more efficient parallel lamination process in which pre-formed layers (e.g. electronic substrate sub-constructions) and interlayer structures (adhesives) are all laminated together in one step. See FIG. 8.

The present invention is based on the development of advanced materials and processes that improve the speed, accuracy and efficiency of multilayer circuit board assembly and bonding. In particular, the present invention provides improved bonding layer structures and assemblies containing preformed z-axis interconnects (vias), which can be pre-filled with conductive paste to speed vertical interconnection of electronic substrate subconstruction layers containing circuitry.

The invention z-axis interconnection structures thus provide a means to fabricate a wide variety of multilayer electronic substrate constructions (or subconstructions) from electronic substrate subconstruction "building blocks." It will be understood by the skilled artisan that these defined building blocks can be used in any combination, including combinations with conventional electronic substrate subconstructions formed using copper-plated-vias or with copper-plated through holes, and/or with copper foil. Accordingly, the present invention provides substrate z-axis interconnection structures that include a bonding layer and at least one hole that is filled with a conductive paste.

Bonding Layer Films

The present invention also provides bonding layers in a film configuration rather than as a glass- or rubber-containing prepreg and as such, the films does not contain glass or other fibers that limit the thinness of the film. Instead, the bonding film is formed exclusively from thermosetting resins, which have comparable laser ablation requirements and responses.

Particularly suitable bonding films are prepared from two different thermosetting resins, such as a c-staged resin and a b-staged resin. In one embodiment, the c-staged thermoset resin replaces the rubberized matrix used in traditional film adhesives and the glass fiber matrix used in traditional prepregs. The c-stage polymer matrix behaves much like a glass weave, but without the negative characteristics for conductive paste z-axis interconnection. In certain aspects, a pre-cured high-temperature thermoset resin matrix is incorporated into the bonding films according to the present invention. The high-temperature thermoset resin can be, for example, an epoxy. Unlike the rubberized matrix used in films for flex, epoxy matrix is crosslinked (c-staged) to better mimic woven glass without the differential lasing characteristics, poor dielectric performance and resin wetting issues common to glass. The three-dimensional reinforcing matrix is important for dimensional stability, flow control and CTE control. Resin systems contemplated for use as the matrix polymer include epoxies, cyanate esters, bismalemides, acrylics, polyesters, polysulfones.

The c-stage matrix can be infiltrated with a b-stage polymer that is suitable for tack lamination. For compatibility with the c-stage matrix, the b-stage polymer has a high temperature cure onset, a long shelf life, and very little lateral flow. However, the b-stage polymer must also develop high adhesion to the circuit layers and deform/flow sufficiently during lamination to encapsulate the fine circuit features. These objective can be accomplished in part, by filling a high temperature polymer that has a high cure onset temperature with an inorganic filler to reduce flow and CTE.

Benzoxazines are a class of b-stage resins that can be used as adhesive films as described in U.S. Patent Publication No. 2012/0141753 (Hunrath). However, the benzoxazine adhesive films described by Hunrath were engineered for high flow characteristics that would be unsuitable for the present invention. Nevertheless, the advantageous adhesive characteristics of the benzoxazine resin system can be exploited when combined with a c-stage polymer matrix (described above) to produce a bonding film with a low-flow characteristic suitable for invention structures.

The selection of benzoxazines as the b-stage portion of the bonding film confers additional benefits for the laser ablation operations. In addition to being suitable for laser ablation with $CO_2$ lasers, as are most adhesive systems, benzoxazines will darken with exposure to UV wavelengths and this darkening enables absorption of UV laser energy sufficient to effect UV laser ablation. This compatibility with both $CO_2$ and UV laser ablation renders benzoxazine-containing bonding film of the present invention versatile in the production of electronic substrates, enabling implementation in a broader array of fabricator facilities, the potentially faster throughput of UV versus $CO_2$ and the smaller feature size ablation capability of UV lasers.

Co-Cured Bonding Films

Although the c-stage matrix can be preformed and then infiltrated with the b-stage resin, a particularly exciting observation is that c-stage and b-stage components can be mixed as interpenetrating polymer network (IPN) formulations and co-cast to form bonding films of the invention.

This creates a very homogeneous composite film without the need to infiltrate a pre-formed mat of polymer.

According to this embodiment of the invention, the bonding film is prepared by mixing together two different types of polymers that interpenetrate each other, but don't interact chemically to affect the cure of the other polymer. The first component polymer is a c-stageable resin (e.g. an epoxy), which cures to form a c-stage, fully crosslinked reinforcing matrix, at temperatures below 100° C., even when intermixed with the second component polymer. The co-curing bonding films of the invention are advantageously isotropic, and homogeneous mixtures at the scale of via holes.

Figure 2:
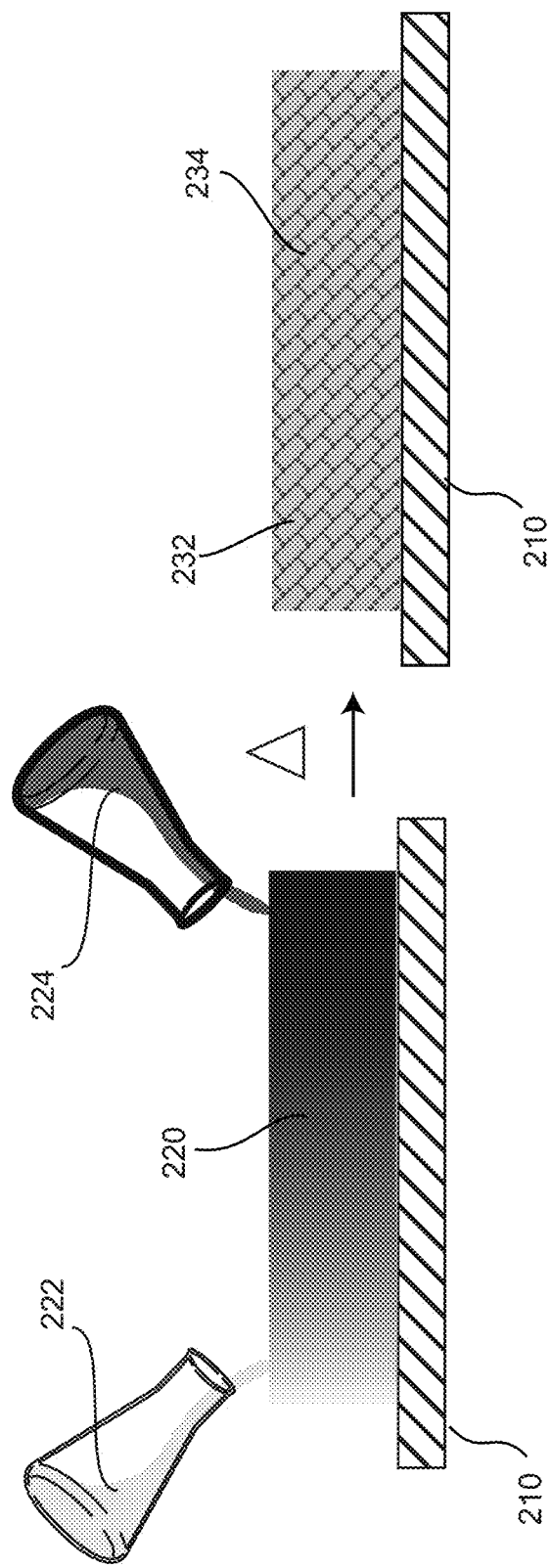
FIG. 2 is a diagram illustrating the casting of a bonding film according to one embodiment of the invention.

FIG. 2 conceptually depicts the casting of a bonding film of the present invention from a liquid mixture (220) containing a b-stageable formulation 222 and a c-stageable formulation 224, cast onto a carrier sheet (210) and processed at low temperature to create an interpenetrating polymer network (IPN) of c-staged resin matrix (234) and b-staged adhesive resin (232).

The second polymer is a high cure temperature, b-stageable adhesive that solidifies as the c-stage is forming, but does not fully cure. The b-stage portion of the film thus formed can be tack laminated and subsequently fully cures at lamination temperature.

The matrix (c-stage) resin component and the b-stage thermosetting resin according to the invention are miscible, and thus maintain a homogeneous mixture within the prepared adhesive film, but cure by different mechanisms.

The c-stage thermosetting resin that forms the matrix is a low-temperature-cure thermoset resin, with a cure temperature below about 100° C., such as 95° C., 90° C., 85° C., 80° C., 75° C., 70° C., 65° C., 60° C., 55° C., 50° C., 45° C., 40° C., 35° C., 30° C., or room temperature. Low- temperature cure epoxies have been found to be suitable for use as the c-stage thermoset in the co-cured bonding films of the invention.

The b-stage thermosetting adhesive resin can be any high cure temperature thermoset that has high bondability, which is consistently low flow over a long shelf life and will not advance during via formation and conductive paste installation steps. In certain aspects, the b-stage thermosetting resin that is mixed with the c-stage matrix resin has an onset of cure greater than 160° C., such as about 165° C., about 170° C., about 175° C., about 180° C., about 185° C., about 190° C., about 195, about 200° C., about 210° C., about 225° C., about 250° C., about 300° C. or greater than about 300° C. Benzoxazines (described above) have been found to be suitable b-stage resins for use in the preparation of co-cure bonding films of the invention.

The bonding film can be cast directly onto and/or may be overlaid by a protective sheet(s). Materials suitable for use as protective sheets include metal foils, paper, coated paper, and polymers, specifically thermoplastic polymers, such as polyethylene terephalate.

In embodiments in which the bonding film is not tack laminated onto the electronic substrate substructure, application of a protective sheet to both surfaces of the bonding film may be useful for protecting the b-stage portion of the bonding film from contamination during process and handling steps, such as laser ablation and conductive paste installation. In these embodiments, the protective sheet on one major surface may be the carrier on which the bonding film was cast, or the carrier may be removed and discarded and a more suitable protective sheet applied. The use of a protective sheet is not required in the production or use of invention structures, but it can facilitate the fabrication process.

In addition to the c-stage reinforcing matrix, a particulate filler may be added to the bonding film to retard the flow of the b-stage adhesive resin. Addition of a particulate filler prevents the b-stage resin from recoating the bottom of the via hole after laser ablation, prevents excessive lateral movement of the resin from displacing the vias and/or a portion of the conductive paste therein, and prevents intermixing of the b-stage resin and conductive paste that might prevent development of an electrically conductive pathway at the periphery of the via. Particulate fillers suitable for use in the co-cure bonding films of the invention include silica, fumed silica, talc, Teflon beads, graphite, alumina, boron nitride. Presently preferred is 1 to 2 micron talc.

Conductive Pastes

Conduct pastes are also a key component of the present invention that enables the formation of bonding layers containing z-axis interconnects that in turn, allow parallel assembly and lamination of multilayer electronic substrates and substrate substructures. As indicated above, bonding layers, and particularly bonding films of the invention, include at least one hole that is filled with a conductive paste. The holes can be formed by any method available in the art, but are typically formed by laser ablation.

The holes are then filled with conductive paste using methods known in the art. The holes may be filled directly with fluid conductive paste, or bumps of conductive paste may be applied to the electronic substrate substructure in the pattern of the holes in the bonding film and thereafter penetrate and fill the holes in the bonding film when it is subsequently aligned to the substructure and connecting electronic substrate substructure prior to lamination. The filled holes are suitable for alignment and conductive interconnection with copper pads thereby vertically connecting two or more circuit layers.

In certain embodiments, a single bonding film contains more than one hole, such as a plurality of holes (at least 3) or a multiplicity of holes (at least 10), and such holes are arranged in pattern corresponding to the points on a matching electronic substrate substructure that require vertical connection. Both the bonding film and conductive paste of the invention contribute to the ability to generate z-axis interconnections in mated layers that retain their pattern registration during preparation, alignment and lamination. In some aspects, the electronic substrate substructure bear a conductive paste bump at the point of z-axis interconnection that will be aligned with the laser ablated holes in a bonding film.

TLPS Pastes

A variety of connective pastes are known in the art. However, the invention is most advantageously carried out when TLPS pastes are used to form the z-axis electrical connections.

A typical TLPS composition suitable for use in the present invention includes at least one first particle comprising at least one high-melting-point metal (M); and at least one second particle that includes a low-melting-temperature alloy of a metallic element (Y) that is reactive with M, and an organic vehicle. In certain aspects, the TLPS paste compositions contains only a single type of first particle (i.e., contains only one size particle, containing e.g. an elemental form of only one high melting point metal, M). In other aspects, more than one type of first particle is present (e.g., containing different high melting point metals, or particles of different sizes, shapes etc.).

Similarly, the composition can contain a single type of second particle comprising Y, such as a single alloy of Y, or multiple types of particles including, which can include different alloys of Y compositions, elemental forms of Y, as wells additional elements, coatings, sizes, shapes and the like.

High melting point metal M can be, for example, copper, silver, gold, palladium, nickel, aluminum or a combination of these elements, and is typically copper.

Low melting point metal Y can be, for example, tin, bismuth, zinc, gallium, indium, tellurium, mercury, thallium, antimony, selenium, polonium or a combination of these elements, and is typically tin.

Optionally, a facilitator element X, can also be present in the TLPS compositions and when present can be, for example, bismuth, indium, lead, silver, copper, antimony, gold, nickel or a combination of these elements, and is typically bismuth.

In certain embodiments of the invention, the particles of the TLPS compositions of the invention can include a coating, such as a saturated fatty acid, an unsaturated fatty acid, a metal, a metal alloy, an inorganic metal salt, an organic metal salt, a metal alkoxide, and a triazole.

Exemplary TLPS pastes contemplated for use in this preferred embodiment are those described in any of U.S. Pat. Nos. 6,716,036; 5,980,785; 5,948,533; 5,922,397; 5,853,622; 5,716,663; 5,830,389; 8,221,518 and U.S. Patent Application Publication No. 2011-0171372, which are incorporated in their entirety by reference. During the lamination cycle required to mechanically connect the electronic substrate substructures with the bonding film, the alloy particles within the TLPS paste will melt and wet to both the copper pads and copper particles within the paste forming a continuous, metallurgically alloyed pathway. Advantages of TLPS paste formulations are illustrated in FIG. 6.

Figure 6A:
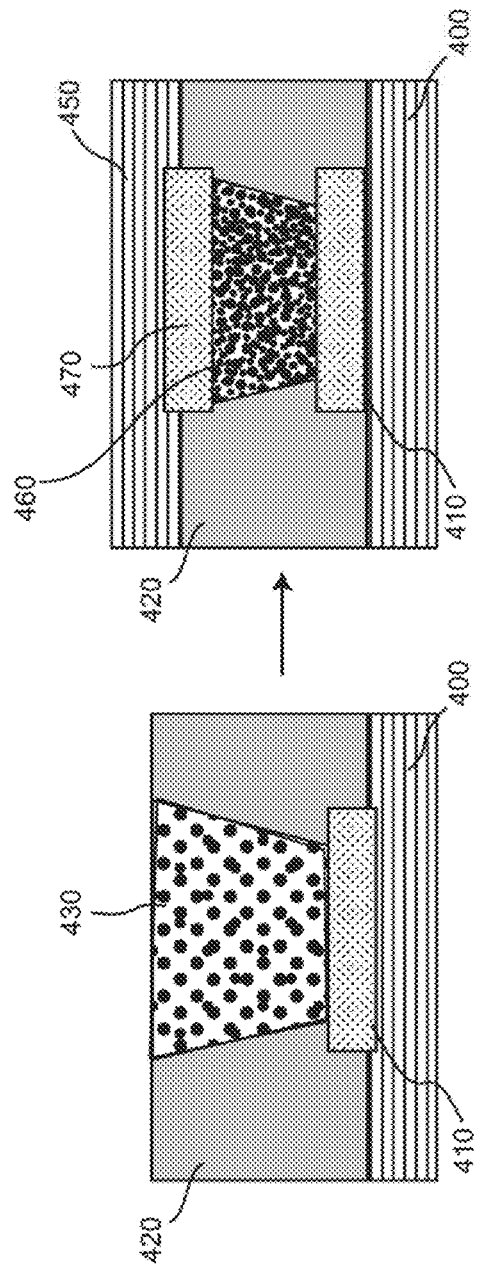
FIGS. 6A and 6B shows a cross-section of a z-axis interconnect structures according to embodiments of the invention before and after lamination.
Figure 6B:
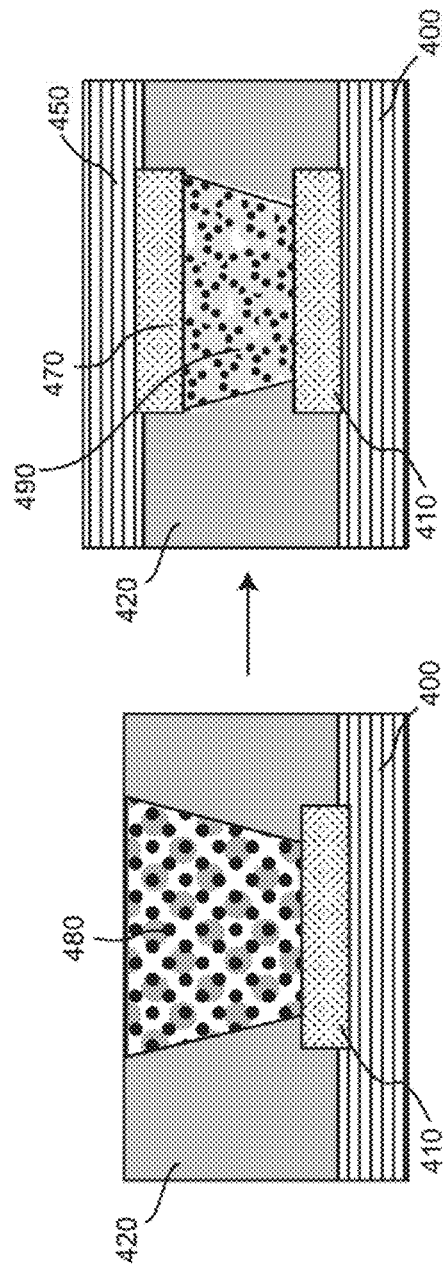

FIGS. 6A and B depict z-axis interconnect structures before and after lamination with a mating electronic substrate subconstruction consisting of a c-staged polymer dielectric (450) bearing a copper pad circuit feature (470). In both FIG. 6A and FIG. 6B the bonding film (420) is the same. In FIG. 6A, the conductive paste (430 before lamination; 460 after lamination) is the conventional type in which the metal particles form a continuous electrical connection from pad (410) on, e.g., polymer glass reinforced epoxy laminate (400) to pad (470) by compression of the conductive paste and physical contact between metal particles and between the metal particles and copper pads. In FIG. 6B, the conductive paste (480 before lamination; 490 after lamination) is the type that undergoes metallurgical bonding between metal particles and between the metal particles and the copper pads through sintering or TLPS to form a continuous electrical pathway from copper pad (410) on, e.g., polymer glass reinforced epoxy laminate (400) to copper pad (470).

The above-described conductive paste compositions can be applied using various techniques, including, but not limited to, needle dispensing, stenciling, screen printing, ink jetting, extrusion, casting, spraying, pad transfer, gravure or other methods that would be known to those of skill in the art. Once applied, the described compositions are typically thermally processed in a lamination press. The specific thermal process conditions are dependent upon the film adhesive used to join the electronic substrate substructures.

Sintering is a process wherein adjacent surfaces of metal powder particles are bonded by heating. Liquid phase sintering is a special form of sintering where the solid powder particles coexist with a liquid phase. Densification and homogenization of the mixture occur as the metals diffuse into one another and form new alloy and/or intermetallic species.

In transient liquid phase sintering (TLPS) of powders, the liquid only exists for a short period of time as a result of the homogenization of the metals to form a mixture of solid alloy and/or intermetallic species. The liquid phase has a very high solubility in the surrounding solid phase, thus diffusing rapidly into the solid and eventually solidifying. Diffusional homogenization creates the final composition without the need to heat the mixture above its equilibrium melting point.

The TLPS pastes employed in certain embodiments of the invention are prepared by admixing small particles of a reactive metal with solder alloy particles in a fluxing vehicle. At least one element within the solder alloy powder is reactive with the metal in the small metal particles. As the temperature is raised to the melting point of the solder alloy, the particles become molten. This transition can be observed as an endothermic event in differential scanning calorimetry (DSC). The reactive element(s) within the solder alloy then react with the receptive metal powder to form new alloy compositions and intermetallics. The formation of intermetallic species may be observed as an exothermic event using DSC. The diffusion and reaction of the reactive element(s) from the low melting alloy and the receptive metal particles continues until the reactants are fully depleted, there is no longer a molten phase at the process temperature, or the reaction is quenched by cooling the mixture. After cooling, subsequent temperature excursions, even beyond the original melt temperatures, do not reproduce the original melt signature of the mixture. This is the signature of a typical low temperature transient liquid phase sintered (hereinafter: TLPS) metal mixture.

The present invention also provides methods for preparing the TLPS composition disclosed herein, that include the steps of: 1. providing at least one high-melting-point metal M in particulate form, at least one low-melting-temperature alloy comprising Y in particulate form, and an organic vehicle, and 2. combining the particles and organic vehicle in the following proportions, based on the total weight of the composition:

i) between about 20 wt. % and about 70 wt. % of the least one high-melting-point metal M in particulate form;

ii) between about 20 wt. % and about 70 wt. % of the least the at least one low-melting-temperature alloy in particulate form;

iii) between about 1% and about 30 wt. % of the organic vehicle, thereby preparing the TLPS composition.

Z-Axis Interconnect Bonding Structures

The present invention thus provides z-axis bonding layers (structures) that can be used to join various electronic layer building blocks or electronic substrate subconstructions to fabricate a wide variety of multilayer electronic substrate constructions. In the preparation of the boding layers, bonding films described herein may be cast on a protective sheet, or a protective sheet can be applied to the surface of the bonding film for protection and ease of handling. In some embodiments the overlaid protective sheet may remain on the film adhesive through the process steps of laser ablation of the via holes and installation of a conductive paste, such as a TLPS paste. Leaving the overlaid protective sheet on the film adhesive during these process steps provides a job-specific, conformal, temporary stencil that protects the surface of the bonding film from contamination prior to lamination with the mating electronic substrate subconstructure.

To form multilayer electronic substrates, in some embodiments the z-axis interconnect bonding films are tack-laminated to substrate substructures prior to alignment, assembly and lamination to form multilayer electronic substrates. In some embodiments, an overlaid protective sheet may remain on the film adhesive during tack lamination to an electronic substrate substructure or may be added to the construction during this process.

The bonding films of the invention can be used to laminate a variety of electronic substrate substructures including, but not limited to: 1. metal foil, preform, clip, lead frame, tape, or other configurations; 2. dielectric sheets composed of an inorganic material such as ceramic or glass, thermoplastic polymer, thermosetting polymer in either b-stage or c-stage form, reinforced or unreinforced, filled or unfilled with particulate matter, and any combination thereof; 3. dielectric sheets as described in item 2 above where the dielectric sheet is traversed with holes that may or may not be filled with a conductive medium; 4. dielectric sheets as described in item 3 above where the dielectric sheet also bears metallization on one major surface, and wherein the metallization may be patterned or unpatterned; 5. dielectric sheets as described in item 3 above where the dielectric sheet bears metallization on both major surfaces, and where the metallization may be patterned or unpatterned; 6. A core consisting of a plurality of dielectric and metallization layers wherein the outermost surfaces of the core bear metallization, and where: a. the metallization on at least one side may be patterned; b. the core may be wholly and/or partially traversed by plated through holes, where the plated through holes may be filled or unfilled, and where the filler may be electrically conductive or not; c. the core may be partially traversed by electrically conductive vias that provide z-axis electrical connection between metallization layers in one or more locations, said vias being formed from copper plating, conductive paste, or a combination thereof.

It will be understood by those of skill in the art that the above types of electronic substrate substructures can be employed in a variety of combinations in the practice of the invention in order to obtain the desired multilayer electronic substrate in one or a few lamination cycles.

Turning to FIG. 1, which illustrates a variety of non-limiting examples z-axis interconnect structures (10-60) as they can be used to interconnect electronic substrate subconstructions in the manufacture of an electronic substrate such as a circuit board. At the top of the figure is z-axis interconnection (10) in which bonding film (100) and protective sheet (120) have been tack laminated to a metal foil (70), blind vias have been laser ablated through the protective sheet (120) and bonding film (100) and these blind vias have been filled with conductive paste (80). Moving downward in the expanded view is electronic substrate subconstruction (20) in which a polymer laminate bearing copper foil on both sides has been etched to form copper circuits (75) and which has been laser ablated to form blind vias (90) that have been plated with copper to effect z-axis interconnection. Z-axis interconnection structure (30) consists of a bonding film (100) that has been overlaid on both surfaces by a polymer protective sheet (120) with through vias filled with conductive paste (80) that traverse the bonding film and both protective sheets. In the center of the figure, electronic substrate substructure (40), a core, consists of a polymer laminate composed of a c-staged dielectric layer (130) bearing copper foils that have been etched into circuits (75) and that is traversed by a plated through hole (110). Next down is a z-axis interconnection structure in which and electronic substrate substructure similar to (20) has been tack laminated to a bonding film (100) and overlying polymer protective sheet (120), laser ablated to form blind vias that extend through the protective sheet and bonding film and are filled with conductive paste (80). Finally, bonding film (140) with through vias coupled with bumps of conductive paste (150) stenciled onto electronic substrate substructure (60) illustrate a 2-part z-axis interconnection structure. Electronic substrate substructure (60) consists of a c-staged polymer dielectric (130) traversed by via holes filled with conductive paste (160) that has been thermally processed and bearing etched copper circuits on either side (75). In order to manufacture an electronic substrate from this expanded stack up, the protective sheets (120) would be removed, the z-axis interconnect structures (10, 30, 140+150/160) and electronic substrate subconstructions (20, 40) be aligned and laminated, and copper foils (70) would be etched to form the outer layers of circuitry.

Electronic Substrate Interconnection Structures

In one embodiment, the invention provides an electronic substrate interconnection assemblies comprising: 1. conductive pastes to form the requisite continuous z-axis electrical connection during lamination; 2. a bonding film that, after film formation from a liquid mixture, develops a c-stage reinforcing matrix of polymer intimately entwined with a b-stage adhesive that is substantially non-reactive below lamination temperatures and has an integral flow control mechanism to ensure no-flow characteristics prior to lamination; and an electronic substrate substructure to which the film adhesive is coupled.

In another embodiment, invention structures employ an electronic substrate z-axis interconnection structure that includes: 1. A bonding film that includes a. a c-stage matrix that is formed from a thermosetting resin that cures at less than 100° C. and does not segregate from the b-stage resin system during cure; b. a b-stage thermosetting resin interpenetrating the c-stage matrix, which has an onset of cure greater than 160° C.; and c. optionally, a particulate filler; 2. a pattern of holes traversing the bonding film; and 3. a conductive paste that fills the holes.

In another embodiment, invention structures provide electronic substrate z-axis interconnection structures that include: 1. comprising: an electronic substrate substructure; bearing a bonding film that includes: a. a c-stage matrix that is formed from a thermosetting resin that cures at less than 100° C. and does not segregate from the b-stage resin system during cure; b. a b-stage thermosetting resin interpenetrating the c-stage matrix, which has an onset of cure greater than 160° C.; and c. optionally, a particulate filler; 2. a pattern of holes traversing the bonding film; and 3. A conductive paste that fills said pattern of holes.

In yet another embodiment, invention structures include electronic substrate z-axis interconnection assemblies comprising: 1. an electronic substrate substructure bearing a pattern of bumps formed from a conductive paste; and 2. a bonding film that includes: a. a c-stage matrix that is formed from a thermosetting resin that cures at less than 100° C. and does not segregate from the b-stage resin system during cure; b. a b-stage thermosetting resin interpenetrating the c-stage matrix, which has an onset of cure greater than 160° C.; and c. optionally, a particulate filler; in which the bonding film is traversed by a pattern of holes that align with the pattern of bumps on the electronic substrate substructure when said electronic substrate substructure and the bonding film are brought together.

In certain embodiments of the invention, TLPS pastes (described above) are the conductive paste used to form the z-axis electrical connections. During the lamination cycle required to mechanically connect the electronic substrate substructures with the film adhesive, the alloy particles within these TLPS paste melt and wet to both the copper pads and copper particles within the paste forming a continuous, metallurgically alloyed pathway.

The bonding films of the invention have been specifically designed with the following attributes:
- The bonding film is composed entirely of polymers, which have comparable laser ablation requirements to each other;
- The bonding film is cast in a single step from a liquid pre-mixture of two or more resins;
- The c-stage reinforcing matrix of the film is formed from a thermosetting resin that cures below 100° C. and does not segregate from the b-stage resin system during co-cure (the b- and c-staged resins are miscible and therefore, remain intermixed but discrete without the need to infiltrate a pre-cured mat);
- The b-stage portion of the bonding film can be modified with additives and/or fillers as needed so that it will not flow significantly during any of the pre-processing steps necessary prior to lamination; and
- The b-stage portion has a cure onset temperature greater than 160° C. to ensure long shelf life and to prevent chemical interaction with the conductive paste prior to sintering in the lamination profile.

Therefore, in one embodiment, the invention may be described as an electronic substrate interconnection structure comprising: an electronic substrate substructure (as defined above); bearing a bonding adhesive, that is preferably an IPN bonding film comprising: 1. a c-stage portion that is formed from a thermosetting resin that cures below 100° C. and does not segregate from the b-stage resin system during cure; b. a b-stage thermosetting resin interpenetrating the c-stage portion, which has an onset of cure greater than 160° C.; and c. optionally, a particulate filler; where the bonding adhesive is traversed by a pattern of holes, which are filled with, and/or aligned with bumps formed from, a conductive paste on the electronic substrate substructure.

In the practice of the invention, at least one of the claimed electronic substrate interconnection structures is combined with an electronic substrate substructure (as defined above) and laminated to produce an electronic substrate with two or more layers of metallization. In the case in which the electronic substrate substructure(s) comprise an unpatterned copper foil, common industry practices such as print-and-etch would be necessary to form the outer circuit layers and complete the fabrication of the multilayer electronic substrate.

Figure 7:
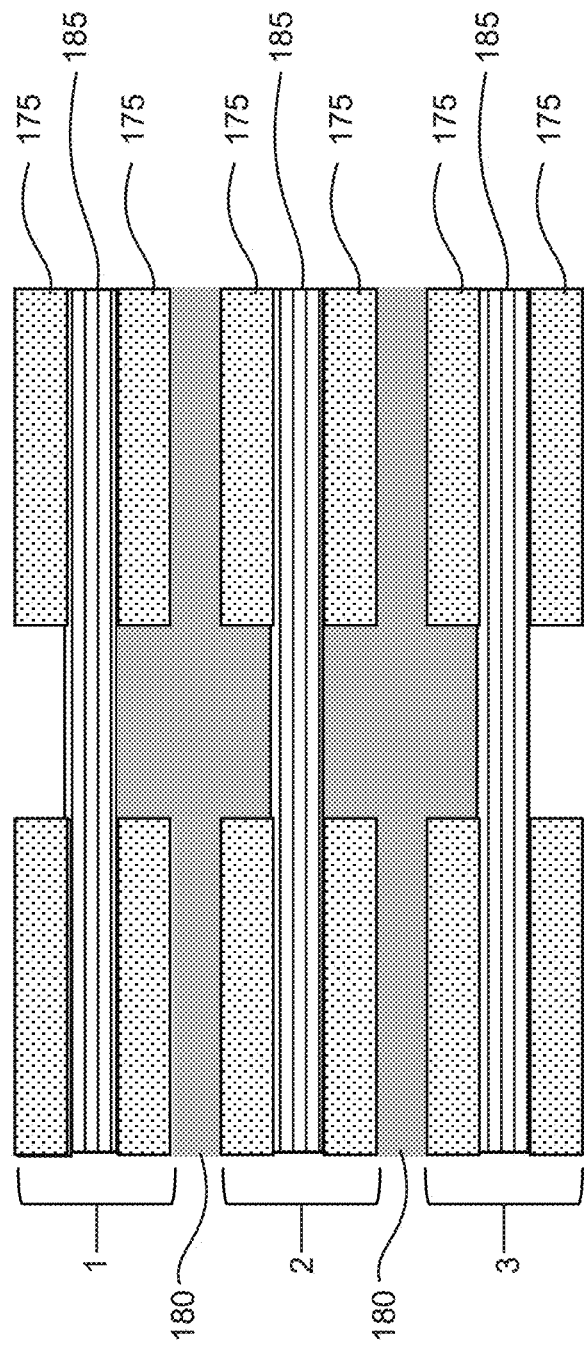
FIG. 7 is cross-sectional view through an exemplary electronic substrate structure prepared according to an embodiment of the invention.

FIG. 7 depicts an exemplary electronic substrate structure employing two invention z-axis interconnect structures in which the bonding films (180) have been tack laminated onto the electronic substrate substructures (1 and 2), each including an epoxy glass laminate (185) with copper circuitry layers on each side (175), and aligned with a third electronic substrate substructure (3) prior to lamination.

The invention is used to best advantage in applications in which a multiplicity of electronic substrate interconnection structures are laminated with an electronic substrate substructure in a single lamination cycle to produce a complex multilayer electronic substrate. Other advantageous applications for invention structures include the lamination of dissimilar electronic substrate interconnection structures and electronic substrate substructures and fabrication schemes with multiple, sequential laminations.

Although invention electronic substrate z-axis interconnection structures are most commonly used to effect z-axis mechanical and electrical interconnection in multilayer printed circuit boards, the inventors envision a wide range of applications that would benefit from such constructions. Examples of such applications include mixed-mode circuit boards in which a PCB of one type (e.g. high frequency or HDI) is mated with a PCB of another type (e.g. standard density or flexible circuit). Other applications that can benefit from the versatility and performance of invention z-axis interconnections would include: flip-chip interconnection of a semiconductor die, thermal transfer, semiconductor package, interposer, connector, optical waveguide, area array attach, interconnecting electronic substrates fabricated with dissimilar dielectric materials such as polymer-based with ceramic- or glass-based, interconnecting subconstructions of very large format printed circuit boards that are too large to be conventionally processed as a single unit.

The attributes of the bonding film of the instant invention are beneficial for making interconnects with any type of conductive paste. TLPS pastes, conventional metal-filled polymers, nano-sintering materials, nano-micron hybrids can all benefit from the consistent via hole definition, absence of resin on the bottom pad, controlled flow, long shelf life, and tolerance of pre-lamination processes afforded by this adhesive material.

By designing the bonding film with both the paste interconnect process and the HDI electronic substrate formfactor and performance requirements in mind, implementation of conductive paste z-axis interconnect becomes straightforward. The entire materials set has been designed to work together, with minimal impact to standard electronic substrate manufacturing processes, and to support thin high-density electronic substrates with high electrical performance characteristics. With this integrated system design for the electronic substrate z-axis interconnection structure, proper flow control of the resin can be tailored to the conductive paste to maintain the unreacted paste in a well-defined via shape and not allow resin interference with the formation of an electrical connection to the copper pads. The interconnect is therefore dense, continuously interconnected from pad-to-pad, and consistent from via-to-via.

The bonding film system described herein not dependent on glass fabric, thermal aging, or other processing for flow control so the resin effect on the conductive paste via is predictable and consistent over a long shelf life. Also, the film is a stand-alone dielectric without the electrical performance and thickness constraints imposed by glass, but with thermal properties similar to a lead free compatible glass reinforced system. The conductive paste z-axis interconnects can therefore be short in height, which is advantageous for mitigating CTE mismatch, in addition to the capability of placement anywhere in the electronic substrate, and the overall structure can be very thin. Because the matrix and resin are both polymer-based, laser drilling is faster and more consistent, and, in embodiments in which the bonding film is tack laminated to an electronic substrate substructure, the underlying copper pad is exposed to less heat and possible grain size effects. The smooth, uniform shape of the lased vias also facilitates consistent high-quality fill of the TLPS paste.

The invention one- and two-part building block structures for z-axis interconnection enable a multilayer HDI electronic substrate manufacturing process that is less demanding on the electronic substrate fabricator while providing the same reliability as copper plated microvias. In some embodiments, invention structures enable the production of electronic substrates with entirely new architectures.

The invention may be better understood with reference to the following, non-limiting examples.

EXAMPLES

Example 1

TLPS paste Ormet 701 (Ormet Circuits, Inc., San Diego, Calif.) was installed in three test vehicles, copper clad epoxy/phenolic laminate, the bonding sheet was cast with a protective sheet and was applied together (simultaneously) to the copper clad laminate containing multiple daisy chains such that each daisy chain had several tens to hundreds of TLPS z-axis via interconnections connected in series. Three different bonding sheets were tested by applying each to one circuit pattern of each of the test vehicles along with a polymer protective sheet which is polyester (such as polyethylene terephathalate; Mylar®) using a tack laminating process. The bonding sheets used in this Example were: 1. Isola 370HR (Isola Group, Chandler, Ariz.), a standard glass fabric reinforced prepreg containing a multifunctional epoxy/phenolic resin blend reinforced with electrical grade glass fabric (Tg 180° C.); 2. Isola 406N, a no-flow prepreg containing a multifunctional epoxy reinforced with glass fabric, that bonds surfaces together with minimal flow (Tg 165°); and Insulectro Zeta LE (Integral Technologies, Inc, Lake Forrest, Calif.) a b-stage benzoxazine polymer/c-stage epoxy blend, no-flow bonding film, supplied with a protective sheet already applied (Tg 165°). Each bonding sheet was applied according to manufacturer's directions.

Via holes were then laser ablated with a $CO_2$ laser in a range of holes sizes (4 mils, 6 mils, 8 mils and 10 mils), into each of the bonding sheets such that the via holes traversed both the polymer protective sheet and the bonding sheet with the holes terminating on the copper pad beneath. Ormet 701 TLPS paste was then applied to the via holes in a two-step process: first, using a polymer squeegee, and second, followed by a metal squeegee. The polymer protective sheet was removed from each test vehicle. The solvent in the Ormet 701 paste was then evaporated in an oven at 95° C. A mating circuit was placed on top of the filled via assembly, and each test vehicle was processed according to the bonding sheet manufacturer's recommended conditions to form laminated test vehicles. For each bonding sheet, the lamination conditions exceeded 175° C., which is the minimum temperature for TLPS processing of Ormet 701.

The resistance of the daisy chains was then measured in the laminated test vehicles. The daisy chain test coupons containing many paste vias in electrical series were subjected to 6×288° C./10 sec. solder floats to simulate the component assembly process, with resistance measurements made after each thermal excursion. The results are summarized in Table 1 below.

TABLE 1

| Bonding sheet | Highest change in resistance after 6 solder floats (%) |
|---|---|
| Isola 370HR (conventional prepreg) | <15 |
| Isola 406N (no-flow prepreg) | <10 |
| Insulectro Zeta LE film (no-flow film) | <1 |

Example 2

Electronic substrates with daisy chain patterns of electrical circuits were fabricated as described in EXAMPLE 1. The daisy chain patterns were interconnected in the z-axis by vias and the size of the vias was varied from daisy chain to daisy chain, as described above. After processing, which effected a TLPS reaction in the Ormet 701 paste, several daisy chains prepared from each bonding sheet were potted in resin and cut, polished to reveal the interconnect, and examined under an optical microscope equipped with several different objectives lenses and lighting effects to determine the extent of interaction between the bonding film and the conductive paste at the via wall interfaces. The results are summarized in Table 2 below.

TABLE 2

| Bonding sheet | Sintering of TLPS paste at Interface with adhesive |
|---|---|
| Isola 370HR (conventional prepreg) | Poor |
| Isola 406N (no-flow prepreg) | Good |
| Insulectro Zeta LE film (no-flow film) | Excellent |

In constructions prepared with conventional Isola 370HR prepregs, the sintering paste was infiltrated at the interface and the metal particles at the interface did not sinter into the finished z-axis interconnect, resulting in an effective reduction in the diameter of the via. The reduction in diameter of the via due to this phenomenon resulted in higher electrical resistivity through the via than anticipated and a reduced capacity to handle high current and were thus graded a "poor" result. In both the no-flow prepreg and the bonding film of the invention, this phenomenon is not observed, with the most complete sintering observed with the no-flow film (excellent sintering). These paste particles stayed tightly in position until sintered. The no-flow pregreg performed well, maintaining the shape of the ablated via, but the conductive paste demonstrated a small amount of intermingling of the paste and bonding sheet adhesive at the interface and thus was graded "good". The Zeta LE bonding pre-cured epoxy matrix in the no-flow film did not exhibit any interaction with the conductive paste and thus was graded "excellent".

Example 3

Electronic substrates with daisy chain patterns of electrical circuits were fabricated as described above in EXAMPLE 1. The daisy chain patterns were interconnected in the z-axis by vias and the size of the vias was varied from daisy chain to daisy chain. After processing to effect a TLPS reaction in the Ormet 701 paste, several daisy chains prepared from each bonding sheet were cross-sectioned and examined under a microscope as described in EXAMPLE 2 to determine whether the vias maintained the as-lased shape and position throughout the subsequent operations of conductive paste filling, solvent extraction, and lamination. The results are summarized in Table 3, below.

TABLE 3

| Bonding sheet | Via Shape Retention |
|---|---|
| Isola 370HR (conventional prepreg) | Fair-poor |
| Isola 406N (no-flow prepreg) | Good |
| Insulectro Zeta LE film (no-flow film) | Good |

As in EXAMPLE 2, the conventional prepreg construction using Isola 370HR bonding sheets, demonstrated fair to poor performance with the via demonstrating a shape that suggested the resin in the bonding sheet became highly fluid during the lamination cycle and caused the via shape to have a swept appearance. The via construction formed in the no-flow prepreg demonstrated good shape and position retention, but in some cases the laminated via height was equal to the height of the reinforcing glass mat. The closure to the thickness of the glass highlighted the design restrictions on thickness of the electronic substrate that are imposed by the size of the glass mats and may be a source of delamination defects if the resin has been excluded from the interface between the glass mat and the circuit pad. The vias in the no-flow bonding film demonstrated a bow outward at the via walls from the vertical compression, but the interface between the bonding film and conductive paste remained distinct and the position of the vias was unchanged from the as-ablated condition.

Example 4

Electronic substrates with daisy chain patterns of electrical circuits were fabricated as in EXAMPLE 1. The daisy chain patterns were interconnected in the z-axis by vias and the size of the vias was varied from daisy chain to daisy chain, as described above. Several daisy chains were cross-sectioned and examined under a microscope as described above, to determine whether the bonding film resin had flowed back onto the copper pads at the bottom of the vias subsequent operations of conductive paste filling, solvent extraction, and lamination. The results are summarized in Table 4, below.

TABLE 4

| Bonding sheet | Sintering of TLPS paste at interface with copper pad at the bottom of the hole |
|---|---|
| Isola 370HR (conventional prepreg) | Fair |
| Isola 406N (no-flow prepreg) | Good |
| Insulectro Zeta LE film (no-flow film) | Excellent |

Figure 3:
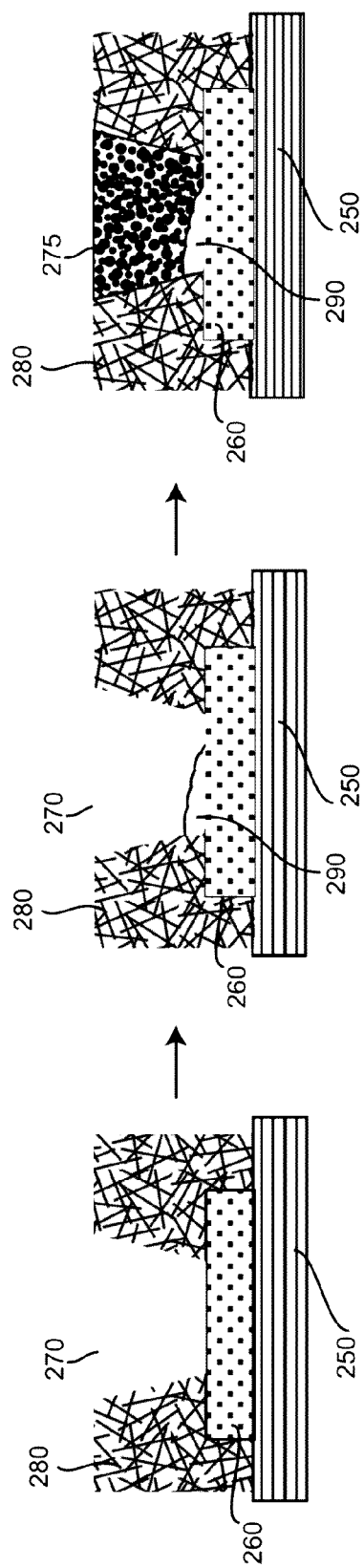
FIG. 3 is a cross-sectional drawing illustrating flow of conventional bonding sheet into undesirable areas.

As in EXAMPLE 2, the conventional prepreg construction using Isola 370HR bonding sheets, demonstrated fair to poor performance. In many cases there was a clear line of demarcation between the sintering paste and the copper pad. This type of interference at the paste-to-pad-interface often results in poor electrical performance and reliability. An illustration of these results is shown in FIG. 3. The structure on the left side of FIG. 3 illustrates a conventional bonding sheet (280) that has been tack laminated onto an electronic substrate substructure (copper pad 260 and e.g., polymer glass reinforced epoxy laminate 250) and laser ablated to form a blind via (270) down to copper pad (260). The center structure of FIG. 3 shows the same structure at the end of the laser ablation cycle or with the passage of time and illustrates the deleterious flow of the bonding sheet resin (290) back onto the copper pad (260). The left side of FIG. 3 illustrates the center structure after filling the via with conductive paste (275), showing the gap in conductive material that the flow of the bonding sheet resin (290) creates between the filled via (275) and the copper pad (260).

The line of demarcation was less distinct in the vias formed in the no-flow prepreg with isolated areas of interference being more predominant. In the vias formed in the bonding film of the invention, the line of demarcation was not observed.

Example 5

Electronic substrates with daisy chain patterns of electrical circuits were fabricated as in EXAMPLE 1, however, the fabrication process was halted after the laser ablation step and the vias were inspected by microscope. In all of the constructions employing a bonding sheet with a glass mat reinforcement, cut ends of the glass mat protruded into the via from the wall and the cut ends were charred. This defect is illustrated in FIG. 5.

Figure 5:
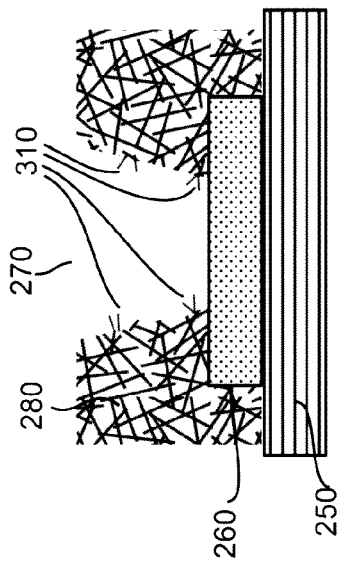
FIG. 5 is a cross-sectional drawing illustrating protrusion of glass fibers into blind vias with conventional prepreg.

FIG. 5 shows the glass bundle ends (310) that protrude into a blind via (270) formed in a conventional prepreg (280) that has been tack laminated an onto electronic substrate subassembly (250+260).

In the constructions fabricated with the bonding film of the invention, which has an integral c-stage polymer reinforcement rather than a glass mat, the via walls were smooth and defect-free.

Example 6

A roll of bonding film was prepared by admixing components comprising the polymer constituents that form a c-stage epoxy matrix, a benzoxazine resin, curatives, talc and solvent into a fluid mixture (e.g. 62% benzoxazine (Araldite® MT 35700, bisphenol F benzoxazine; Huntsman, The Woodlands, Tex.), 15% filler (talc), 12% epoxy (Epon® 828, bisphenol A diglycidyl ether epoxy; Polysciences, Warrington, Pa.), 8% phenoxy, 3% Teta catalyst (triethyleneteramine; curative)). The mixture was passed through a slot-die coating apparatus onto a carrier film. The coating was then heated to evaporate the solvent and effect cure of the c-stage matrix, and a protective sheet was applied from a roll. FIG. 2 is a conceptual depiction of the coating and heating steps described.

Figure 4:
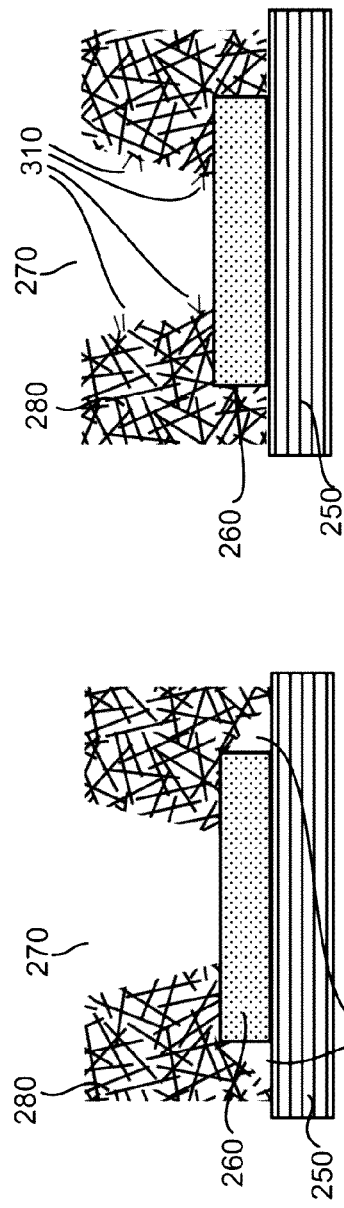
FIG. 4 is a cross-sectional drawing illustrating air entrapment with conventional prepreg.

Two weeks after the preparation of the roll of bonding film, a portion of the roll was cut off, removed from the carrier, and tack laminated onto an electronic substrate subconstruction using a vacuum frame heated to 95° C. After tack lamination the structure formed was inspected. In some prior art constructions, the tack lamination process results in air entrapment between the bonding sheet and the circuit layer. This air entrapment was often seen at the edges of the circuits as illustrated in FIG. 4. This figure shows depicts the air entrapment pattern (300) observed using a conventional prepreg (280) that had been stored poorly or for an excessive period prior to tack lamination onto electronic substrate substructure (250+260).

These pockets of air entrapment are a potential source of delamination defects in the final electronic substrate product. The air entrapment pockets may also induce electrical shorting defects due to escape of the conductive paste from the vias during the lamination cycle used to produce the electronic substrate product. Inspection of the tack laminated structure formed with the bonding film of the invention did not display the air entrapment defects.

Six months after the preparation of the roll of bonding film, a second portion of the roll was cut off, removed from the carrier, and tack laminated onto an electronic substrate subconstruction as before. Inspection of the tack laminated structure did not reveal any defects. This experiment demonstrated the long room temperature stability of the benzoxazine resin used as the b-staged adhesive in the bonding films of the invention. Laser ablation of vias by $CO_2$ laser into the bonding films tacked onto the substrates after two weeks and six months of storage demonstrated very high quality with smooth walls, consistent shape and clean copper exposed at the bottom. This is in contrast to similar vias laser ablated, also to $CO_2$ laser, into conventional prepreg.

What is claimed is:

1. An electronic substrate z-axis interconnection structure comprising:
   a. a bonding film comprising:
      i. a reinforcing matrix of c-stage thermosetting resin surrounded by a b-stage thermosetting resin; and
      ii. optionally, a particulate filler;
   b. at least one hole traversing the bonding film, wherein the at least one hole is filled with a conductive paste.

2. The z-axis interconnection structure of claim 1, wherein the c-stage thermosetting resin and the b-stage thermosetting resin are co-cast from a miscible mixture of a c-stageable resin and a b-stageable resin that cure independently but remain intermixed, wherein optionally the c-stage thermosetting resin cures at a temperature less than 100° C. and the b-stage thermosetting resin has a cure onset temperature greater than 160° C.

3. The z-axis interconnection structure of claim 1, wherein the c-stage thermosetting resin is selected from the group consisting of epoxies, phenolics, acrylics, polyesters, polyimides, cyanate esters and combinations thereof, wherein the epoxy is optionally selected from the group consisting of bisphenol A, bisphenol F, Novolac, aliphatic and glycidylamine based epoxies.

4. The z-axis interconnection structure of claim 1, wherein the b-stage thermosetting resin is selected from the group consisting of benzoxazines, polyimides, bismaleimide-triazines and combinations thereof, wherein optionally the benzoxazine is bisphenol F benzoxazine.

5. The z-axis interconnection structure of claim 1, comprising at least two holes traversing the bonding film that are filled with the conductive paste.

6. The z-axis interconnection structure of claim 1, comprising a plurality of holes traversing the bonding film that are filled with the conductive paste, wherein the plurality of holes is arranged in a pattern.

7. The z-axis interconnection structure of claim 1, further comprising at least one protective sheet covering a major surface of the bonding film, wherein optionally the protective sheet is selected from the group consisting of a metal foil sheet, a paper sheet, a coated paper sheet, and a polymer sheet.

8. The z-axis interconnection structure of claim 7, wherein the bonding film is cast directly on the protective sheet.

9. The z-axis interconnection structure of claim 7, wherein the at least one hole traverses the least one protective sheet.

10. The z-axis interconnection structure of claim 1, wherein the conductive paste is a sintering paste, wherein optionally the sintering paste is a transient liquid phase sintering paste.

11. An electronic substrate z-axis interconnection assembly, comprising:
   a. two z-axis interconnection structures according to claim 1; and
   b. a dielectric sheet between the two z-axis interconnection structures, wherein the dielectric sheet optionally comprises a material selected from the group consisting of: a ceramic, a glass, thermoplastic polymer, a thermosetting polymer and combinations thereof, wherein the, thermoplastic polymer, or thermosetting polymer is unfilled or is reinforced or filled with particulate matter, optionally tack-laminated together.

12. The z-axis interconnection assembly of claim 11, wherein the assembly comprises at least one hole traversing the assembly, wherein the at least one hole is filled with a conductive paste.

13. An electronic substrate z-axis interconnection assembly comprising:
   a. an electronic substrate substructure; and
   b. at least one z-axis interconnection structure according to claim 1 attached to the electronic substrate substructure, wherein optionally the electronic substrate substructure is selected from the group consisting of a metal foil, a preform, a clip, a lead frame, a tape, a dielectric sheet and a core, wherein optionally the dielectric sheet comprises a material selected from the group consisting of: a ceramic, a glass, a thermoplastic polymer, a thermosetting polymer and a combination thereof, and optionally the electronic substrate substructure is tack-laminated to the electronic substrate substructure.

14. The electronic substrate z-axis interconnection assembly of claim 13, wherein the dielectric sheet further comprises metallization on one or both major surface.

15. The electronic substrate z-axis interconnection assembly of claim 14, wherein the metallization on at least one major surface is patterned.

16. The electronic substrate z-axis interconnection assembly of claim 13, wherein the core comprises a plurality of dielectric and metallization layers.

17. The electronic substrate z-axis interconnection assembly of claim 13, wherein at least one outer major surface of the core is a patterned or unpatterned metallization layer.

18. The electronic substrate z-axis interconnection assembly of claim 17, wherein the core is partially or completely traversed by at least one hole selected from the group consisting of: a plated through hole filled with a conductive paste; a plated through hole filled with a non-conductive paste; an unfilled plated through hole; a plated electrically conductive via filled with a conductive paste; an unplated electrically conductive via filled with a conductive paste; and an unfilled, plated electrically conductive via.

19. An electronic substrate z-axis interconnection assembly comprising:
   a. an electronic substrate substructure bearing at least one bump formed from a conductive paste that was optionally deposited by a method selected from the group consisting of dispensing, jetting, screen printing, stencil printing, pad transfer and gravure, wherein the substrate substructure is optionally selected from the group consisting of a metal foil, a preform, a clip, a lead frame, a tape, a dielectric sheet optionally comprising patterned or unpatterned metallization on one or both major surfaces, and a core, wherein the dielectric sheet optionally comprises a material selected from the group consisting of: a ceramic, a glass, a thermoplastic polymer, a thermosetting polymer and a combination thereof; and
   b. an electronic substrate z-axis interconnection structure comprising at least one hole traversing a bonding film comprising a reinforcing matrix of c-stage thermosetting resin surrounded by a b-stage thermosetting resin, wherein said at least one hole aligns with said at least one bump.

20. The electronic substrate z-axis interconnection assembly of claim 19, wherein the core comprises a plurality of dielectric and metallization layers and optionally, at least one outer major surface of the core is a patterned or unpatterned metallization layer.

* * * * *